US 6,531,686 B2

(12) United States Patent
Park

(10) Patent No.: US 6,531,686 B2
(45) Date of Patent: Mar. 11, 2003

(54) CHUCK PLATE OF ASHING EQUIPMENT FOR FABRICATING SEMICONDUCTOR DEVICES AND CHUCK ASSEMBLY COMPRISING THE SAME

(75) Inventor: Min-O Park, Hwasong-gun (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/956,458

(22) Filed: Sep. 20, 2001

(65) Prior Publication Data

US 2002/0066727 A1 Jun. 6, 2002

(30) Foreign Application Priority Data

Dec. 4, 2000 (KR) ............................................. 00-72878

(51) Int. Cl.7 ............................. H05B 3/68; C23C 16/00
(52) U.S. Cl. .................................... 219/444.1; 118/725
(58) Field of Search .......................... 219/443.1, 444.1; 118/724, 725; 361/233, 234; 156/345.1, 345.14, 345.27, 345.28, 345.51, 345.52, 345.53

(56) References Cited

U.S. PATENT DOCUMENTS

| | | | | |
|---|---|---|---|---|
| 5,275,683 A | * | 1/1994 | Arami et al. | 156/345.51 |
| 5,376,213 A | * | 12/1994 | Ueda et al. | 156/345.27 |
| 5,556,476 A | * | 9/1996 | Lei et al. | 118/728 |
| 5,606,485 A | * | 2/1997 | Shamouilian et al. | 361/234 |
| 5,625,526 A | * | 4/1997 | Watanabe et al. | 361/234 |
| 5,698,062 A | * | 12/1997 | Sakamoto et al. | 118/723 E |
| 6,104,596 A | * | 8/2000 | Hausmann | 279/128 |

* cited by examiner

Primary Examiner—S. Paik
(74) Attorney, Agent, or Firm—Volentine Francos, P.L.L.C.

(57) ABSTRACT

A chuck plate of ashing equipment for fabricating a semiconductor device facilitates the removal of polymer from the lower surface of a wafer while photoresist is being removed from the upper surface of the wafer by etching. The chuck plate has a supporting part whose upper surface is to adhere to and support the entire bottom surface of the wafer lower except a polymer formation region, and a stepped part above which hangs an outer peripheral portion of the wafer that includes the polymer formation region. Accordingly, ashing gas injected into the process chamber of the ashing equipment flows into an opening defined between the upper surface of the stepped part of the chuck plate and the polymer formation region of the wafer and reacts with the polymer. As a result, the photoresist and the polymer are simultaneously eliminated. Thus, the ashing equipment and the wafer require little time to clean after the etching process. Also, the wafer will not contain particles of polymer that would otherwise interfere with subsequent processing of the wafer and lower the manufacturing yield.

32 Claims, 5 Drawing Sheets

CHUCK PLATE OF ASHING EQUIPMENT FOR FABRICATING SEMICONDUCTOR DEVICES AND CHUCK ASSEMBLY COMPRISING THE SAME

BACKGROUND OF THE INVENTION

1. Field of the Invention

The present invention relates to the manufacturing of semiconductor devices. More particularly, the present invention relates to a chuck plate of a chuck assembly of ashing equipment for removing photoresist from the surface of a wafer after an etching process is performed using the photoresist as a mask.

2. Description of the Related Art

Semiconductor devices are made, in part, by removing portions of a semiconductor wafer. These portions of the wafer are exposed by a patterned photoresist, and the exposed portions are then removed by etching. Plasma etching is the main etching process used. In plasma etching, a process gas is transformed into a plasma. The plasma reacts with the portions of the wafer to thereby remove such portions.

A polymer is produced as a by-product of the reaction. The by-product, namely, the polymer, is in the form of a vapor. Accordingly, the polymer is deposited on all of the inner surfaces of the etching chamber as well as on a portion a lower surface of the wafer without any selectivity.

As shown in FIG. 1, the polymer P' is generally formed on the lower surface of the wafer W in a region d of a width of about 8~10 mm extending inwardly from the edge of the wafer W. Consequently, the lower surface of the wafer W adheres to a cathode that is used to execute the plasma etching process. Meanwhile, as shown in FIG. 3, once the wafer W has been etched, the photoresist (PR) is removed from the wafer W through a stripping or ashing procedure. The wafer is then cleaned to remove any PR residue and/or other types of particles that have accumulated on the wafer.

The ashing process for removing the PR from the wafer W is performed by ashing equipment 10, as shown in FIG. 2. First, the wafer W is transferred into an airtight chamber 12 through the door unit 14. The wafer W is supported by a chuck plate 18 of a chuck assembly 16. Then ashing gas G, such as oxygen $O_2$ and nitrogen $N_2$ or the like, is excited by high frequency power so as to assume a plasma state, namely, an ion (radical) state. The plasma is supplied into the airtight chamber 12 via an upper gas supplying unit 22.

The wafer is heated, and under this condition, the ashing gas G in the state of plasma reacts with the PR, and the reaction removes the PR and forms the polymer P' vapor. The vapor is discharged through an exhaust pipe 24 connected to a vacuum pressure forming unit (not shown). However, as mentioned above, some of the vapor solidifies on the lower surface of the wafer W. In this case, the polymer P' adheres to an upper surface of the chuck plate 18. Thus, it becomes difficult to foster the reaction between the plasma and the PR. Furthermore, heat is conducted from a lower part 20 of the heater through the chuck plate 18. This heat burns a component of the polymer P', such as the PR component. The carbon produced as a result contaminates the chuck plate 18 and the wafer W.

Still further, although the polymer P' existing on the lower surface of the wafer W is subjected to the cleaning process after the etching process is completed, the polymer P' is not readily removed by such process. Thus, the presence of the polymer P' prolongs the cleaning process. Furthermore, if the next process is executed without removing the polymer P', the polymer P' can give rise to defects that lower the production yield.

SUMMARY OF THE INVENTION

Accordingly, an object of the present invention is to substantially obviate one or more of the limitations and disadvantages of the related art.

More specifically, the primary object of the present invention is to reduce the time necessary for cleaning ashing equipment after the equipment has been used to etch away photoresist from a wafer, and to prevent the etching process from creating defects that would otherwise adversely impact the subsequent processing of the wafer, whereby the manufacturing yield is improved.

To achieve these objects, the present invention provides a chuck plate, and a chuck assembly comprising the same, that facilitate the removal of polymer from the lower surface of a wafer during the time photoresist is being plasma etched from the upper surface of the wafer. The chuck plate has a central supporting part whose upper surface is horizontal so as to support the bottom surface of a wafer, and a stepped part extending radially outwardly from the supporting part and having an upper surface disposed at a level below the upper surface of the supporting part. The upper surface of the stepped part is designed to support the bottom surface of the wafer except for an outer peripheral portion thereof that includes the polymer formation region.

To this end, the upper surface of the supporting part has an outer shape corresponding to but smaller than that of the wafer, including the so-called flat zone of the wafer. Alternatively, the outer shape of the upper surface of the supporting part is circular and has a radius smaller than the radius of curvature of the arcuate portion of the outer edge of the wafer.

Preferably, the upper surface of the supporting part and the upper surface of the stepped part are vertically spaced from one another by 0.3~0.5 mm. Also, the upper surface of the stepped part extends radially outwardly to at least the axial projection of the outer peripheral edge of the wafer. The heater of the chuck plate assembly can therefore extend beneath the stepped part so as to transfer heat to the polymer formation region that overhangs the supporting part so as to be disposed above the upper surface of the stepped part.

Furthermore, the chuck plate may have an outermost peripheral part forming a protrusion that extends upwardly beyond the upper surface of the stepped part. The protrusion may have may extend beyond the plane of the horizontal upper surface of the support part and may have an inclined inner side surface so as to serve as a guide when the wafer is lowered onto the chuck plate.

The inner side surface of the protrusion may have a sectional shape, in a horizontal plane, corresponding to that of the outer edge of the upper surface of the supporting part, i.e., may have a horizontal sectional shape corresponding to that of the wafer or one that is circular. In the latter case, the outer edge of the upper surface of the supporting part and the inner side surface of the protrusion are positioned relative to one another so as to accommodate the entire outer peripheral edge of the wafer therebetween.

Based on the fact that a polymer will typically form over 8~10 mm of the outer peripheral region of the bottom surface of the wafer, the inner side surface of the protrusion is designed to be spaced from the outer peripheral edge of the wafer by 0.5~1.5 mm. Furthermore, the outer edge of the upper surface of the supporting part and the inner side surface of the protrusion are preferably spaced horizontally across from one another by 10.5 ~12.5 mm.

In accordance with the present invention, ashing gas injected into the process chamber of the ashing equipment in the state of plasma can flow into an opening defined between the upper surface of the stepped part of the chuck plate and the polymer formation region of the bottom surface of the wafer. The plasma reacts with the polymer thereby vaporizing the same. As a result, the photoresist and the polymer are simultaneously removed from the wafer.

BRIEF DESCRIPTION OF THE DRAWINGS

These and other objects, features and advantages of the present invention will be better understood from the following detailed description thereof made with reference to the accompanying drawings, of which.

DETAILED DESCRIPTION OF THE PREFERRED EMBODIMENTS

The preferred embodiments of the present invention will now be described in detail with reference to FIGS. 4–6.

Figure 1:
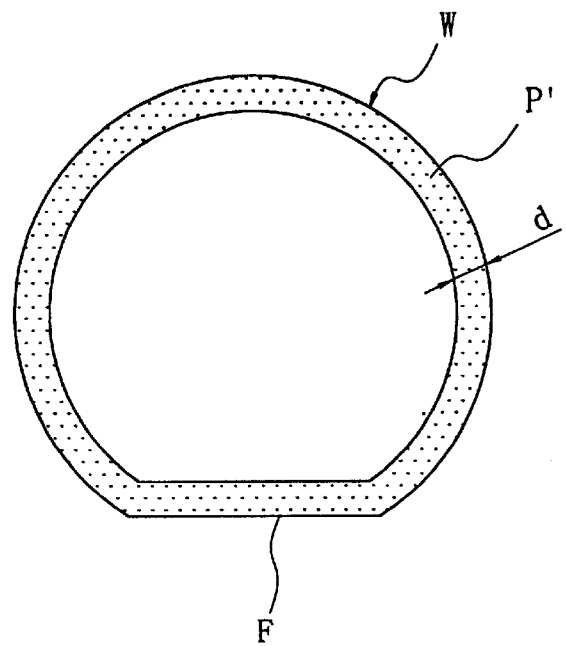
FIG. 1 is a bottom view of a wafer showing the formation of polymer thereon after a plasma etching process is performed.
Figure 2:
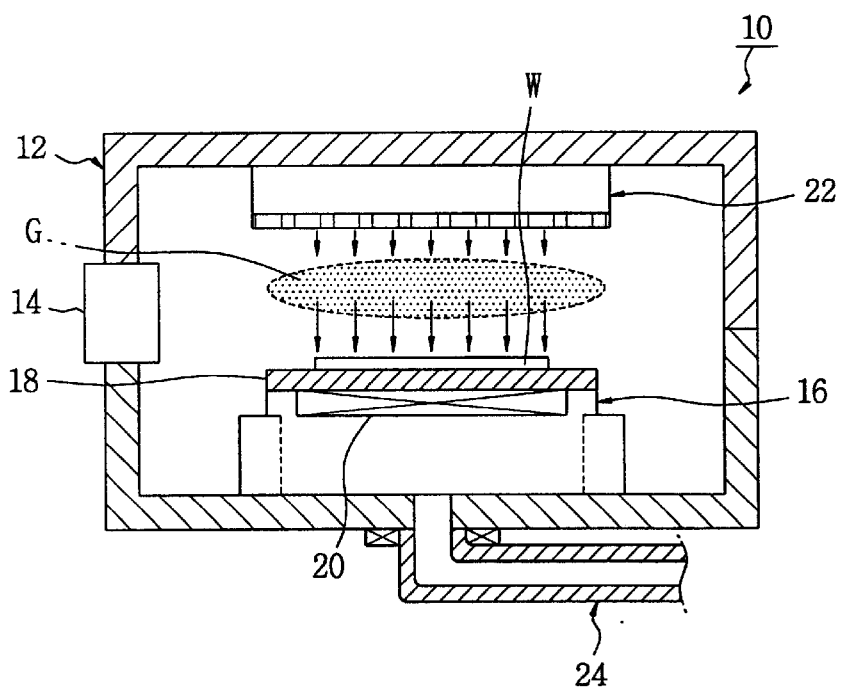
FIG. 2 is a sectional view of conventional ashing equipment for removing photoresist from a wafer after the plasma etching process is performed.
Figure 3:
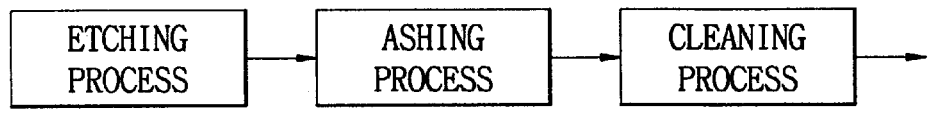
FIG. 3 is a block diagram of the progression of certain processes in the manufacturing of a semiconductor device, including the plasma etching process.
Figure 4:
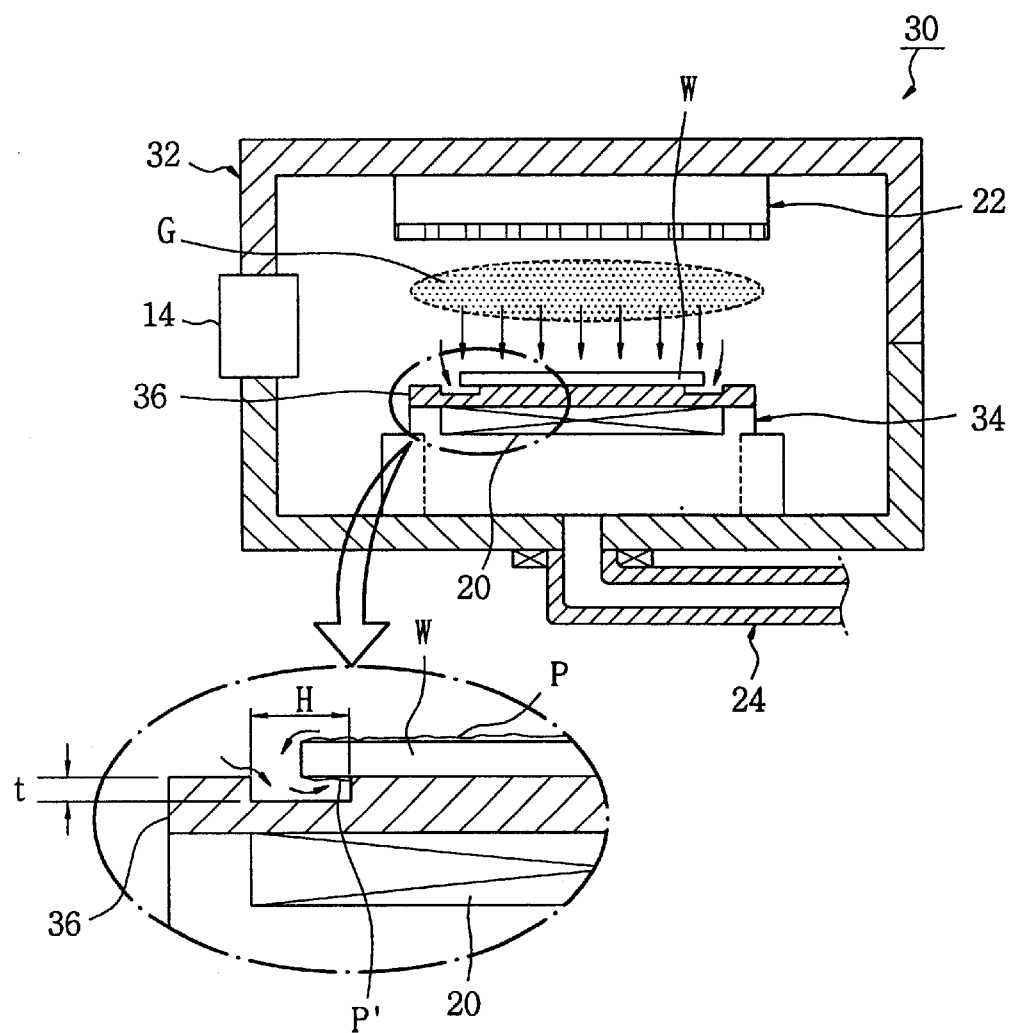
FIG. 4 is a sectional view of ashing equipment including a chuck assembly having a chuck plate according to the present invention.

As shown in FIG. 4, ashing equipment 30 comprises a chamber 32 defining a sealed space, and a door unit 14 disposed at one side of the chamber 32. The door of the door unit 14 can be selectively opened and closed to facilitate the loading and unloading of a wafer W. Furthermore, an exhaust pipe 24 is connected to the chamber 32 to discharge residual gas from the inside of the chamber 32. One end of the exhaust pipe 24 is connected to a side wall of the chamber 32, whereas the other end of the exhaust pipe 24 is connected to a vacuum pressure forming unit (not shown). The vacuum pressure forming unit can be of any known type suitable for creating a vacuum within the exhaust pipe 24.

A gas supplier 22 is disposed at the top of the chamber 32 for injecting a constant amount of ashing gas G in the state of plasma into the chamber and onto a wafer W loaded in the chamber 32. A chuck assembly 34 supports the wafer W in a position at which the upper surface of the wafer W confronts the gas supplier 22.

The chuck assembly 34 includes a chuck plate 18 against which the bottom surface of the wafer W rests, an elevator extending through the central portion of the chuck plate 18, and a heater 20 disposed beneath the chuck plate 18. The elevator receives a wafer W from an external robot (not shown) that transfers the wafer W into the chamber 32, and then descends to set the wafer W stably on the chuck plate 36. The heater 20 raises the temperature of the photoresist P of the wafer W to facilitate the reaction thereof with the plasma G.

The various forms of the chuck plate will now be described in detail with reference to FIGS. 5a–5f, 6 and 7.

Figure 5A:
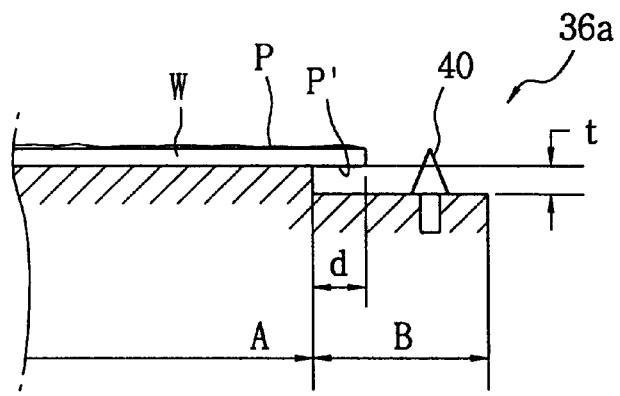
FIGS. 5a through 5f are sectional views of part of respective embodiments of a chuck plate of a chuck assembly of ashing equipment according to the present invention.
Figure 6:
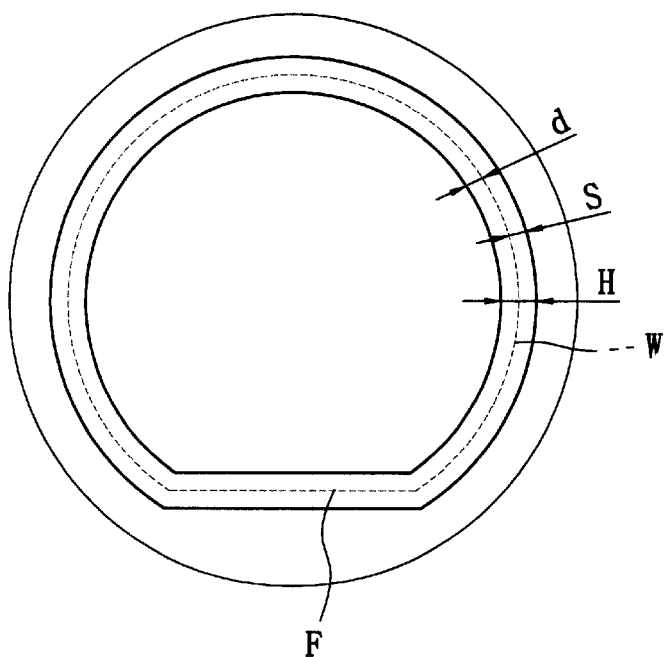
FIG. 6 is a plan view of one form of the chuck plate of the present invention, showing a gas-introducing recess thereof.

The chuck plate 36a shown in FIGS. 5a and 6 has a supporting part A whose upper surface has a shape similar to but smaller than the bottom surface of the wafer W. Accordingly, the supporting part A supports only a central portion of the wafer. On the other hand, a polymer formation region d, namely, an outer peripheral portion of the bottom surface of the wafer where polymer P' forms on the wafer W, extends beyond the upper surface of the supporting part A. The chuck plate 36a also has a stepped part B whose upper surface lies a given distance t beneath the upper surface of the supporting part A.

Thus, the polymer formation region d of the wafer W overhangs the supporting part A of the chuck plate so as to be spaced above the upper surface of the stepped part B of the chuck plate by the distance t. The distance t (height of the step) is within the range of about 0.3~0.5 mm, and the heating element of the heater 20 extends directly beneath the upper surface of the stepped part B. Accordingly, heat from the heater 20 can be transferred from the upper surface of the stepped part B to the polymer P' that has deposited on the bottom surface of the wafer W, i.e., on the polymer formation region d. In addition, the spacing of the upper surfaces of the supporting part A and the stepped part B (distance t) is sufficient to allow the ashing gas injected into the chamber 32 in the form of plasma G to flow into the gap between the upper surface of the stepped part B of the chuck plate 36a and the polymer formation region d.

The upper surface of the stepped part B is designed to extend beyond the outer peripheral edge of a wafer W supported by the chuck plate 36a. Furthermore, a plurality of conical guide pins 40 project upwardly from the upper surface of the stepped part B at a portion thereof located radially outwardly of the outer peripheral edge of a wafer W. The plurality of guide pins 40 also extend beyond the plane of the upper surface of the supporting part A so as to guide the edge of the wafer W while the wafer W is being lowered onto the chuck plate 36a by the elevator.

In addition, although the transition surface of the chuck plate 36a that extends between the upper surface of the supporting part A and the upper surface of the stepped part B is shown as extending perpendicular to such upper surfaces, the transition surface may nonetheless be inclined (may extend at an angle other than 90°) relative to the upper surfaces of the supporting part A and stepped part B.

Figure 5B:
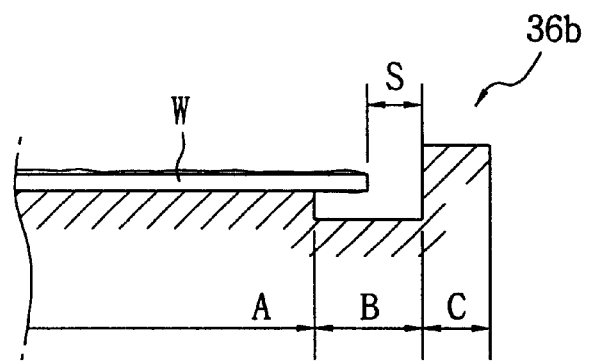

The chuck plate 36b shown in FIG. 5b also includes a supporting part A and stepped part B whose upper surfaces are spaced apart by a distance t (height of the step) of about 0.3~0.5 mm, similarly to the chuck plate 36a of FIG. 5a. However, the chuck plate of FIG. 5b includes an outer peripheral portion C that has a protrusion projecting upwardly beyond the plane of the upper surface of the stepped part B and extending contiguously therearound.

Figure 5C:
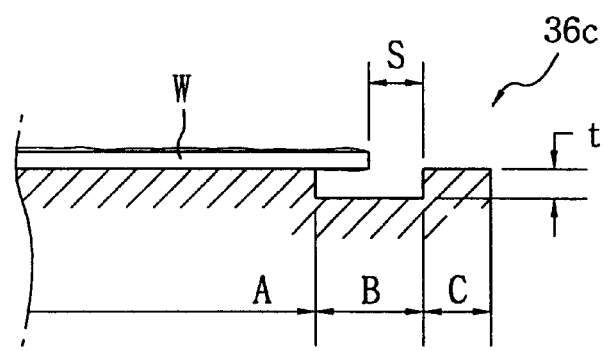

In the chuck plate 36c of FIG. 5c, the projection at the outer peripheral portion C of the chuck plate 36c terminates in an upper horizontal surface that is coplanar with the upper surface of the supporting part A of the chuck plate 36c.

Figure 5D:
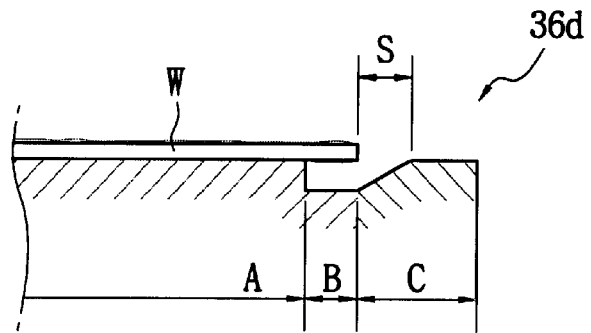

In the chuck plate 36d of FIG. 5d, the upper surface of the stepped part B terminates at the same radial position as the outer peripheral edge of the wafer W. The protrusion of the outer peripheral part C of the chuck plate 36d has an upper horizontal surface that is coplanar with the upper surface of the supporting part A, like the chuck plate of FIG. 5c. However, the inner side surface of the protrusion extends at an inclination from the horizontal upper surface thereof to the outer edge of the upper surface of the stepped part B.

In addition, each of the chuck plates 36c and 36d of FIGS. 5c and 5d may be provided with the guide pins 40 shown in FIG. 5a so as to guide a wafer W into position as the wafer W is lowered onto the upper surface of the supporting part A thereof by the elevator.

Figure 5E:
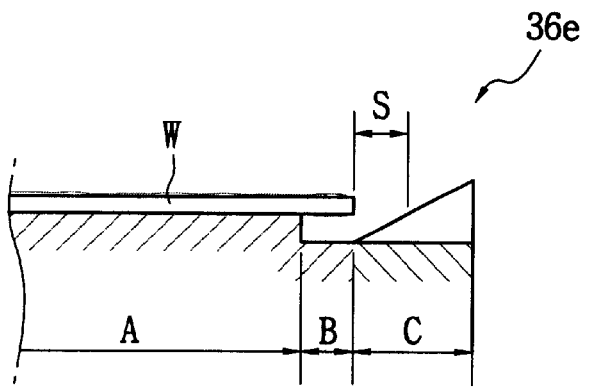

In the chuck plate 36e shown in FIG. 5e, the protrusion of the outer peripheral part C of the chuck plate 36e projects upward beyond the lane of the upper surface of the supporting part A. Furthermore, the inner side surface of the protrusion is inclined so as to readily guide the wafer W onto the supporting part A as the wafer W is lowered onto the chuck plate 36e by the elevator.

In the chuck plates shown in FIGS. 5b through 5e, the supporting part A, the stepped part B and the outer peripheral part C are unitary. That is, the stepped part B may be formed by forming a recess having a given width, depth and shape in a one-piece body just inside the outer peripheral portion of the body. Alternatively, one or more of the respective parts of the chuck plate may be formed separately and then such parts are integrated together.

Figure 5F:
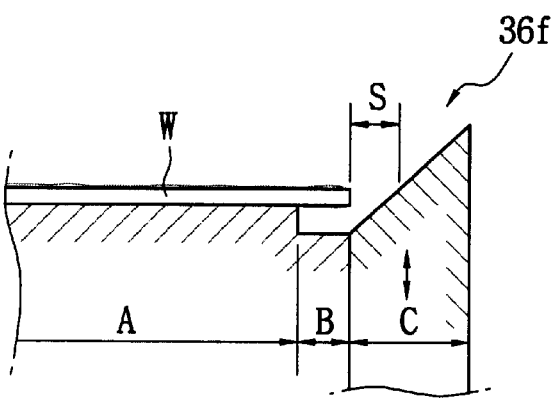

For example, in the chuck plate 36f shown in FIG. 5f, the supporting part A, the stepped part B and the outer peripheral part C are formed as separate pieces. In this case, a stepped part B whose outer edge will lie in the projection of the outer edge of the wafer W is selected for integration with the supporting part A. In addition, the outer peripheral part C is a discrete tubular part that is integrated with the stepped part B in such a way that it can be moved vertically along the outer peripheral surface of the stepped part B, whereby the protrusion can be raised and lowered as indicated by the double-headed arrow in the figure.

As shown in FIG. 6, the shape of the upper surface of the supporting part A may correspond to that of the wafer W, including the flat zone F of the wafer W. Thus, the entire outer edge of the upper surface of the supporting part A will coincide with the location of the inner terminal edge of the polymer formation region d. Alternatively, as shown in FIG. 7, the outer shape of the upper surface of the supporting part A and the inner shape of the protrusion may be circular and concentric, and of respective diameters that will accommodate the flat zone of the wafer W within the confines of the recess as viewed directly from above.

Figure 7:
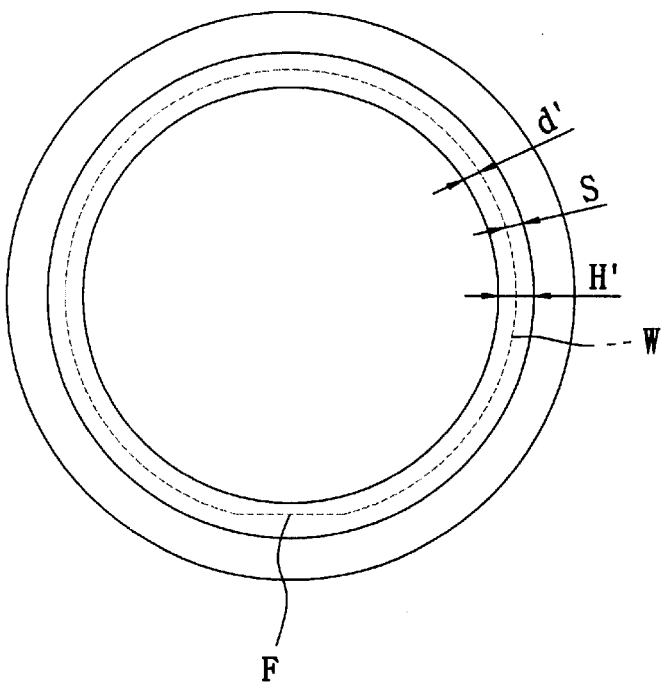
FIG. 7 is a plan view of another form of the chuck plate of the present invention, showing the gas-introducing recess thereof.

As also shown in FIGS. 5b–5f, 6 and 7, a gap S of 0.5~1.5 mm is left between the outer peripheral edge of the wafer W and the inner peripheral surface of the protrusion formed at the outer peripheral part C of the chuck plate. Correspondingly, the interval H between the inner surface of the protrusion and the upper surface of the supporting part A is designed to be about 0~1 mm more than the gap S (0.5~1.5 mm) added to the width (8~10 mm) of the polymer formation region, taken at the flat zone F of the wafer W when the outer shape of the upper surface of the supporting part A corresponds to that of the wafer. In the case in which the outer shape of the supporting part A and the inner shape of the protrusion are circular shape as shown in FIG. 7, the interval H' is set based on the gap between the inner surface of the protrusion and the center of the flat zone F of the wafer W, in a typical application, the interval H' between the outer edge of the upper surface of the supporting part A and the inner surface of the protrusion is 10.5~12.5 mm.

The ashing equipment 30 having a chuck assembly 34 as described above operates as follows.

First, the door of the door unit 14 is opened, and the wafer W is transferred into the chamber 32 by a robot. At this time, the elevator is raised to a position above the chuck assembly 34 where the elevator receives the wafer W from the robot. Subsequently, the robot is withdrawn from the chamber 32, and the door of the door unit 14 is closed to seal the chamber 32. Next, the elevator descends gradually to thereby stably position the wafer W on the upper surface of the chuck plate 36a. During this time, the plurality of guide pins 40 guide the wafer W into position at the center of the chuck plate 36a, that is, onto the upper surface of the supporting part A. In this position, the polymer formation region d confronts the upper surface of the stepped part B and is heated by the heater 20. Under this state, the gas supplier 22 supplies ashing gas G into the chamber in the form of plasma.

The plasma reacts with the photoresist (PR) on the upper surface wafer W, thereby vaporizing the photoresist. Furthermore, the plasma flows between the bottom surface of the wafer W and the upper surface of the stepped part B. Thus, the plasma also reacts with any polymer P' that has been deposited on the bottom surface of the wafer W, i.e. onto the polymer formation region d, to vaporize such polymer P'. Such PR and polymer P' vapors are continuously and sequentially discharged from the chamber 32 through the exhaust pipe 24.

Thus, in accordance with the present invention, the photoresist and the by-product (polymer) of the reaction between the photoresist and the plasma are simultaneously decomposed and eliminated. Accordingly, the ashing equipment can be cleaned in a short period of time, subsequent processes are not affected by the production of the polymer by-product during the ashing process, and a high manufacturing yield can be attained.

Finally, although the present invention has been described above in connection with the preferred embodiments thereof, various changes thereto and modifications thereof will be apparent to those skilled in the art. Thus, all such changes and modifications are seen to be within the true spirit or scope of the invention as defined by the appended claims.

What is claimed is:

1. A wafer chuck plate of a chuck assembly of ashing equipment for use in fabricating a semiconductor device, said chuck plate having a central supporting part having an upper horizontal surface configured to support an inner central part of a wafer not including a polymer formation region of the wafer, and a stepped part disposed directly radially outwardly of said supporting part, said stepped part having an upper surface spaced a predetermined distance below the level of the upper surface of said supporting part, wherein the chuck plate is configured such that a polymer forming region of the wafer is entirely located outside a boundary defined by the upper horizontal surface of the central supporting part.

2. The chuck plate of claim 1, wherein said distance is 0.3~0.5 mm.

3. The chuck plate of claim 1, and further comprising guide pins projecting upwardly from the upper surface of said stepped part beyond the plane in which the horizontal upper surface of said stepped part lies, whereby the guide pins will guide a wafer onto the upper surface of said supporting part as the wafer is lowered onto the chuck plate.

4. The chuck plate of claim 3, wherein said guide pins have upper conical portions, respectively.

5. The chuck plate of claim 1, and further comprising an outer peripheral part disposed radially outwardly of said stepped part, said outer peripheral part comprising a protrusion extending upwardly above the level of the upper surface of said stepped part.

6. A wafer chuck plate of a chuck assembly of ashing equipment for use in fabricating a semiconductor device, said chuck plate having a central supporting part having an upper horizontal surface configured to support an inner central part of a wafer, and a stepped part disposed directly radially outwardly of said supporting part, said stepped part having an upper surface spaced a predetermined distance below the level of the upper surface of said supporting part, and further comprising an outer peripheral part disposed radially outwardly of said stepped part, said outer peripheral part comprising a protrusion extending upwardly above the level of the upper surface of said stepped part, wherein said protrusion has an upper terminal surface that is horizontal and coplanar with the upper horizontal surface of said supporting part.

7. The chuck plate of claim 5, wherein said protrusion has an inner side surface that is spaced horizontally from the outer edge of the upper surface of said supporting part by a distance of 10.5~12.5 mm.

8. The chuck plate of claim 5, wherein an inclined surface extends between and connects the upper surfaces of said supporting part and said stepped part.

9. A wafer chuck plate of a chuck assembly of ashing equipment for use in fabricating a semiconductor device, said chuck plate having a central supporting part having an upper horizontal surface configured to support an inner central part of a wafer, and a stepped part disposed directly radially outwardly of said supporting part, said stepped part having an upper surface spaced a predetermined distance below the level of the upper surface of said supporting part, and further comprising an outer peripheral part disposed radially outwardly of said stepped part, said outer peripheral part comprising a protrusion extending upwardly above the level of the upper surface of said stepped part, wherein said protrusion has an inner side surface that extends upwardly and radially outwardly at an inclination from the upper surface of said stepped part.

10. The chuck plate of claim 9, wherein the inclined inner side surface of said protrusion terminates at a level above the plane in which the horizontal upper surface of said supporting part lies, whereby the inclined surface will guide a wafer onto the upper surface of said supporting part as the wafer is lowered onto the chuck plate.

11. The chuck plate of claim 5, wherein at least one of said supporting part, said stepped part and said outer peripheral part is a piece of the chuck plate that is discrete from the other parts thereof.

12. The chuck plate of claim 11, wherein said outer peripheral part of the chuck plate is a tubular piece of material that is discrete from said stepped part, and is mounted to said stepped part so as to be slidable axially relative thereto, whereby said protrusion can be moved vertically relative to the horizontal upper surface of said supporting part.

13. The chuck plate of claim 12, wherein said protrusion has an inner surface that extends at an inclination upwardly away from the upper surface of said stepped part.

14. The chuck plate of claim 5, wherein said supporting part, said stepped part and said protrusion are unitary.

15. The chuck plate of claim 5, wherein the upper surface of said supporting part has an outer shape that consists of an arcuate portion and a flat portion so as to correspond to the outer shape of a wafer having a flat zone.

16. The chuck plate of claim 5, wherein said protrusion has an inner shape that consists of an arcuate portion and a flat portion so as to correspond to the outer shape of a wafer having a flat zone.

17. The chuck plate of claim 15, wherein said protrusion has an inner shape that consists of an arcuate portion and a flat portion so as to also correspond to the outer shape of a wafer having a flat zone.

18. The chuck plate of claim 5, wherein the upper surface of said supporting part has an outer shape that is circular, and said protrusion has an inner shape that is circular and is concentric with the outer shape of the upper surface of said supporting part.

19. A chuck assembly of ashing equipment for use in fabricating a semiconductor device, said chuck assembly comprising:

a chuck plate having a central supporting part having an upper horizontal surface configured to support an inner central part of a wafer not including a polymer formation region of the wafer, and a stepped part disposed directly radially outwardly of said supporting part, said stepped part having an upper surface spaced a predetermined distance below the level of the upper surface of said supporting part; and a heater disposed beneath said chuck plate, said heater comprising a heating element integral with said chuck plate and extending directly below the upper surface of said stepped part of the chuck plate, wherein the chuck plate is configured such that a polymer forming region of the wafer is entirely located outside a boundary defined by the upper horizontal surface of the central supporting part.

20. The chuck assembly of claim 19, wherein said distance between the upper surfaces of said supporting and stepped parts of the chuck plate is 0.3~0.5 mm.

21. The chuck assembly of claim 19, wherein said chuck plate comprises guide pins projecting upwardly from the upper surface of said stepped part thereof beyond the plane in which the horizontal upper surface of said stepped part lies, whereby the guide pins will guide a wafer onto the upper surface of said supporting part as the wafer is lowered onto the chuck plate.

22. The chuck assembly of claim 21, wherein said guide pins have upper conical portions, respectively.

23. The chuck assembly of claim 19, wherein said chuck plate comprises an outer peripheral part disposed radially outwardly of said stepped part thereof, said outer peripheral part comprising a protrusion extending upwardly above the level of the upper surface of said stepped part.

24. The chuck assembly of claim 23, wherein said protrusion has an inner side surface that is spaced horizontally from the outer edge of the upper surface of said supporting part by a distance of 10.5~12.5 mm.

25. The chuck assembly of claim 23, wherein said chuck plate has an inclined surface that extends between and connects the upper surfaces of said supporting part and said stepped part thereof.

26. The chuck assembly of claim 23, wherein said protrusion has an inner side surface that extends upwardly at an inclination and radially outwardly from the upper surface of said stepped part, the inclined inner surface of said protrusion terminating at a level above the plane in which the horizontal upper surface of said supporting part of the chuck plate lies, whereby the inclined surface will guide a wafer onto the upper surface of said supporting part as the wafer is lowered onto the chuck plate.

27. The chuck assembly of claim 23, wherein said outer peripheral part of the chuck plate is a tubular piece of material that is discrete from said stepped part thereof, and is mounted to said stepped part so as to be slidable axially relative thereto, whereby said protrusion can be moved vertically relative to the horizontal upper surface of said supporting part.

28. The chuck assembly of claim 27, wherein said protrusion has an inner side surface that extends at an inclination upwardly away from the upper surface of said stepped part.

29. The chuck assembly of claim 23, wherein the upper surface of said supporting part of the chuck plate has an outer shape that consists of an arcuate portion and a flat portion so as to correspond to the outer shape of a wafer having a flat zone.

30. The chuck assembly of claim 23, wherein said protrusion has an inner shape that consists of an arcuate portion and a flat portion so as to correspond to the outer shape of a wafer having a flat zone.

31. The chuck assembly of claim 29, wherein said protrusion has an inner shape that consists of an arcuate portion and a flat portion so as to also correspond to the outer shape of a wafer having a flat zone.

32. The chuck assembly of claim 23, wherein the upper surface of said supporting part of the chuck plate has an outer shape that is circular, and said protrusion has an inner shape that is circular and is concentric with the outer shape of the upper surface of said supporting part.

* * * * *